United States Patent [19]

Dhal et al.

[11] Patent Number: 5,759,721

[45] Date of Patent: Jun. 2, 1998

[54] HOLOGRAPHIC MEDIUM AND PROCESS FOR USE THEREOF

[75] Inventors: Pradeep K. Dhal, Acton; Michael G. Horner, West Roxbury; Richard T. Ingwall, Newton; Eric S. Kolb, Ipswich; Parag G. Mehta, Peabody; Richard A. Minns, Arlington; Howard G. Schild, Brighton; David A. Waldman, Acton, all of Mass.

[73] Assignee: Polaroid Corporation, Cambridge, Mass.

[21] Appl. No.: 743,419

[22] Filed: Nov. 1, 1996

Related U.S. Application Data

[63] Continuation of Ser. No. 540,125, Oct. 6, 1995, abandoned.

[51] Int. Cl.$^6$ ........................................ G03H 1/02
[52] U.S. Cl. .................. 430/1; 430/2; 430/290; 430/280.1; 359/3; 522/25; 522/31; 522/29; 522/66; 522/170; 522/172; 522/181
[58] Field of Search .................. 430/1, 2, 3, 290, 430/280.1; 359/1, 3; 522/170, 172, 181, 25, 31, 29, 66

[56] References Cited

U.S. PATENT DOCUMENTS

| | | | |
|---|---|---|---|
| 2,054,099 | 9/1936 | Rothrock | 549/545 |
| 4,156,035 | 5/1979 | Tsao et al. | 427/44 |
| 4,227,978 | 10/1980 | Barton | 204/159.12 |
| 4,310,469 | 1/1982 | Crivello | 260/446 |
| 4,426,431 | 1/1984 | Harasta et al. | 430/14 |
| 4,518,676 | 5/1985 | Irving | 522/170 |
| 4,717,605 | 1/1988 | Urban et al. | 428/1 |
| 4,849,320 | 7/1989 | Irving et al. | 430/280 |
| 4,942,102 | 7/1990 | Keys et al. | 430/1 |
| 5,055,439 | 10/1991 | Allen et al. | 522/25 |
| 5,086,192 | 2/1992 | Kessel et al. | 556/9 |
| 5,102,924 | 4/1992 | Williams et al. | 522/4 |
| 5,213,915 | 5/1993 | Ichihashi et al. | 430/2 |
| 5,260,349 | 11/1993 | Crivello | 522/170 |
| 5,453,340 | 9/1995 | Kawabata et al. | 430/1 |

FOREIGN PATENT DOCUMENTS

| | | | |
|---|---|---|---|
| 324482 | 7/1989 | European Pat. Off. . | |
| 344911 | 12/1989 | European Pat. Off. . | |
| 0389927 | 10/1990 | European Pat. Off. | 522/170 |
| 449027 | 10/1991 | European Pat. Off. . | |
| 0487086 | 5/1992 | European Pat. Off. | 430/1 |

OTHER PUBLICATIONS

Crivello et al., J. Polym. Sci., Polym. Chem. Ed., 32(4), 683 (1994).

Hotta et al., Polymers for Advanced Technologies, 5(2), 90 (1994).

Kawabata et al. "Photopolymer system and its application to a color hologram" Appl. Opt. vol. 33(11) pp. 2152–2156.

Eckberg et al. "Ultraviolet cure of epoxysilanes and epoxysilicones" Poly. Mat. Sci.& Eng. vol. 60 (1989) pp. 222–227.

*Primary Examiner*—Martin Angebranndt
*Attorney, Agent, or Firm*—David J. Cole

[57] ABSTRACT

A holographic recording medium comprises an acid generator capable of producing an acid upon exposure to actinic radiation; a binder; and at least one monomer or oligomer capable of undergoing cationic polymerization initiated by the acid produced from the acid generator. This recording medium is not subject to the disadvantages (for example, oxygen sensitivity) associated with radical-polymerized prior art holographic recording media.

17 Claims, No Drawings

HOLOGRAPHIC MEDIUM AND PROCESS FOR USE THEREOF

This is a continuation of application Ser. No. 08/540,125 filed Oct. 6, 1995, now abandoned.

BACKGROUND OF THE INVENTION

This invention relates to a holographic medium and a process for the use thereof to form a hologram. More specifically, this invention relates to such a medium and process which use cationic polymerization.

In prior art processes for the formation of volume-phase holograms, interference fringes are formed within a holographic recording medium comprising a homogeneous mixture of a polymerizable monomer or oligomer and a polymeric binder; the polymerizable monomer or oligomer must of course be sensitive or sensitized to the radiation used to form the interference fringes. In the light areas of the fringes, the monomer or oligomer undergoes polymerization to form a polymer that has a refractive index different from that of the binder. Diffusion of the monomer or oligomer into the light areas, with consequent chemical segregation of binder from these areas and its concentration in the dark areas, produces spatial separation between the polymer formed from the monomer or oligomer and the binder, thereby providing the refractive index modulation needed to form the hologram. Typically, after the holographic exposure, a post-treatment step of blanket exposure of the medium to actinic radiation is required to complete the polymerization of the monomer or oligomer and fix the hologram.

A known dry-process medium for holographic recording (sold commercially by E.I. du Pont de Nemours, Inc., Wilmington Del.) comprises a polymeric binder, a monomer capable of radical-initiated polymerization, and a photoinitiator (a term which is used herein to include polymerization initiators which are sensitive to radiation outside the visible range, for example ultra-violet radiation). Such a radical-polymerized medium suffers from a number of disadvantages, including severe inhibition of the radical polymerization by atmospheric oxygen, which requires precautions to exclude oxygen from the holographic medium. Also, radical polymerization often results in substantial shrinkage of the medium, with consequent distortion of the holographic image. Furthermore, radical polymerization often results in high intensity reciprocity failure, and it is difficult to record efficiently holograms having low spatial frequency components. Finally, the commercial du Pont medium may require a lengthy thermal post-exposure treatment to fix the hologram.

One important potential use for volume holograms is in data storage; the three dimensional nature of a volume hologram, coupled with the high information density and parallel read/write capability which can be achieved, renders volume holograms very suitable for use in mass data storage; in theory, compact devices having storage capacities in the terabyte ($10^{12}$ byte) range should readily be achievable. However, the aforementioned disadvantages of radical-polymerized holographic media, especially the lengthy thermal treatment, which are particularly serious when the media are to be used for data storage, have hitherto hindered the development of holographic date storage devices.

Holographic media using acid-initiated cationic polymerization would, in theory, be free from most of the aforementioned disadvantages of radical-polymerized media. However, hitherto there has not been produced any holographic medium relying upon cationic polymerization which meets the requirements for practical commercial use. Desirable properties for such use include sufficient difference in refractive index between the light and dark areas of the hologram, and stable microstructure within the hologram and low scattering. The present invention provides such a cationic holographic recording medium and a process for its use.

SUMMARY OF THE INVENTION

Accordingly, this invention provides a process for preparing a hologram, which process comprises:

providing a holographic recording medium comprising an acid generator capable of producing an acid upon exposure to actinic radiation; a binder; and at least one monomer capable of undergoing cationic polymerization initiated by the acid produced from the acid generator; and passing into the medium a reference beam of coherent actinic radiation to which the acid generator is sensitive and an object beam of the same coherent actinic radiation, thereby forming within the medium an interference pattern and thereby forming a hologram within the medium.

This invention also provides a holographic recording medium comprising:

an acid generator capable of producing an acid upon exposure to actinic radiation;

a binder; and at least one monomer or oligomer capable of undergoing cationic polymerization initiated by the acid produced from the acid generator, the medium being capable, upon exposure to an interference pattern formed by interference between two beams of the actinic radiation, of undergoing cationic polymerization of the monomer or oligomer without substantial free radical polymerization occurring in the medium, thereby forming regions differing in refractive index and producing a hologram.

DETAILED DESCRIPTION OF THE INVENTION

As already mentioned, the holographic recording medium of the present invention comprises an acid generator, a binder and one or more monomers or oligomers capable of undergoing acid-initiated cationic polymerization.

The binder used in the present medium and process should of course be chosen such that it does not inhibit cationic polymerization of the monomer or oligomer used. Preferred binders for use in the present process are polysiloxanes and polyacrylates. Because of the wide variety of polysiloxanes available and the well-documented properties of these polymers, the physical, optical and chemical properties of the polysiloxane binder can all be adjusted for optimum performance in the recording medium.

The efficiency of the holograms produced by the present process is markedly dependent upon the particular binder employed. Although those skilled in the holographic art will have no difficulty in selecting an appropriate binder by routine empirical tests, in general it may be stated that poly(methyl phenyl siloxanes) have been found to give efficient holograms.

The acid generator used in the present recording medium produces an acid upon exposure to the actinic radiation. The term "acid generator" is used herein to refer to the component or components of the medium that are responsible for the radiation-induced formation of acid. Thus, the acid generator may comprise only a single compound that produces acid directly. Alternatively, the acid generator may comprise an acid generating component which generates acid and one or more sensitizers which render the acid generating component sensitive to a particular wavelength of actinic radiation, as discussed in more detail below The acid produced from the acid generator may be either a Bronstead acid or a Lewis acid, provided of course that the acid is of a type and strength which will induce the cationic polymerization of the monomer. When the acid generator produces a Bronstead acid, this acid preferably has a $pK_a$ less than about 0. Known superacid precursors such as diazonium, sulfonium, phosphonium and iodonium salts may be used in the present medium, but iodonium salts are generally preferred. Diaryliodonium salts have been found to perform well in the present media, with a specific preferred diphenyliodonium salt being (4-octyloxyphenyl) phenyliodonium hexafluoroantimonate. Among the Lewis acid generators, ferrocenium salts have been found to give good results in the present media, a specific preferred ferrocenium salt being cyclopentadienyl cumene iron(II) hexafluorophosphate, available commercially under the tradename Irgacure 261 from Ciba-Geigy Corporation, 7 Skyline Drive, Hawthorne N.Y. 10532-2188. This material has the advantage of being sensitive to 476 or 488 nm visible radiation without any sensitizer, and can be sensitized to other visible wavelengths as described below.

In the absence of any sensitizer, iodonium salts are typically only sensitive to radiation in the far ultra-violet region, below about 300 nm, and the use of far ultra-violet radiation is inconvenient for the production of holograms because for a given level of performance ultra-violet lasers are substantially more expensive than visible lasers. However, it is well known that, by the addition of various sensitizers, iodonium salts can be made sensitive to various wavelengths of actinic radiation to which the salts are not substantially sensitive in the absence of the sensitizer. In particular, iodonium salts can be sensitized to visible radiation with sensitizers using certain aromatic hydrocarbons substituted with at least two alkynyl groups, a specific preferred sensitizer of this type being 5,12-bis(phenylethynyl)naphthacene. This sensitizer renders iodonium salts sensitive to the 514 nm radiation from an argon ion laser, and to the 532 nm radiation from a frequency-doubled YAG laser, both of which are convenient sources for the production of holograms.

This preferred sensitizer also sensitizes ferrocenium salts to the same wavelengths, and has the advantage that it is photobleachable, so that the visible absorption of the holographic medium decreases during the exposure, thus helping to produce a low minimum optical density ($D_{min}$) in the hologram. Preferred holograms produced by the process of the present invention have been found to have $D_{min}$'s as low as about 0.05 at the recording wavelength.

Any monomer capable of rapid cationic polymerization may be used in the present medium and process, provided of course that, in the unexposed medium, the monomer is compatible with the other components of the holographic medium, and a wide variety of such monomers are known to persons skilled in the polymer art. Preferred monomers for use in the present medium are those containing at least one epoxide or vinyl ether grouping, preferably a cyclohexene oxide grouping. A particularly preferred group of monomers are those in which one or more cyclohexene oxide groupings are linked to an Si—O—Si grouping; these monomers have the advantage of being compatible with polysiloxane binders. Examples of such monomers include those of the formula:

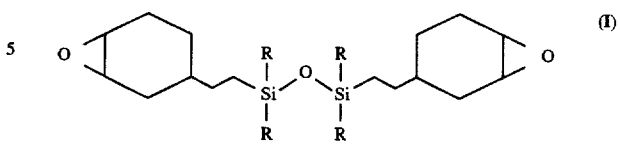

where each R independently is an alkyl group containing not more than about 6 carbon atoms. The compound in which each group R is a methyl group is available from General Electric Company under the tradename General Electric Silicone 479-1893. Another preferred monomer for use in the present media is 1,2-epoxy-1,2,3,4-tetrahydronaphthalene.

Kawabata et al., Applied Optics, 33, 2152–56 (April 1994) describes a photopolymer system and its use to form a hologram. This system comprises a first monomer capable of free radical polymerization, a second monomer capable of cationic polymerization and a single initiator, namely a combination of a cyanine dye and a diphenyliodonium salt, which can, under different conditions, initiate both cationic and free radical polymerization. A hologram is formed by first exposing the system to an interference pattern formed by radiation of a first wavelength (typically 630 nm) at which the combination of the cyanine dye and the diphenyliodonium salt initiates free radical polymerization but essentially no cationic polymerization; thereafter the whole system is blanket exposed to radiation of a second wavelength (typically 254 nm) at which the diphenyliodonium salt initiates both cationic and free radical polymerization. This system is not suitable for carrying out the present process, since the system cannot carry out cationic polymerization without simultaneously effecting substantial free radical polymerization. The recording media of the present invention may be formulated to be essentially free from materials capable of free radical polymerization, since no free radical polymerization is needed to complete the hologram. If, however, the present media do contain material capable of undergoing free radical polymerization, the acid generator should be chosen so that the holographic exposure can be carried out without substantial free radical polymerization taking place.

The holographic efficiency of the holograms produced by the present process is strongly dependent upon the difference between the refractive indices of the two regions present in the hologram, namely the polymer-rich region derived from the polymerization of the monomer or oligomer and the binder-rich region. Provided that there is a difference in refractive index between the two regions, it does not matter which region has the greater refractive index, in so far as the diffractive efficiency of the hologram is concerned.

The proportions of acid generator, binder and monomer or oligomer in the holographic recording medium of the present invention may vary rather widely, and the optimum proportions for specific components and methods of use can readily be determined empirically by skilled workers. However, in general, it is preferred that the present medium comprise from about 1 to about 10 percent by weight of the acid generator, from about 10 to about 89 percent by weight of the binder and from about 10 to about 89 percent by weight of the monomer or oligomer.

In practice, complete polymerization of the monomer or oligomer is not achieved during the holographic exposure. In some cases, however, the microstructure produced during the holographic exposure is sufficiently stable for the hologram to be used without any post-exposure fixing steps. In other cases, it is desirable, after the holographic exposure, to expose the whole of the holographic recording medium to radiation of a wavelength effective to cause further polymerization of the monomer, thereby producing a final hologram essentially free from monomer and hence more stable upon long-term storage than the hologram produced immediately following the holographic exposure. The wavelength of the radiation used in the second, "blanket" exposure need not be the same as that used for the holographic exposure; if, for example, the acid generator employed comprises an acid generating component inherently sensitive to ultraviolet radiation and a sensitizer which sensitizes the acid generating component to visible radiation and the holographic recording is effected with such visible radiation, the blanket exposure may be effected using the ultra-violet radiation to which the acid generating component is inherently sensitive.

The following Examples are now given, though by way of illustration only, to show details of particularly preferred reagents, conditions and techniques used in preferred media and processes of the present invention.

EXAMPLE 1

A holographic recording medium was prepared comprising a 4:1 w/w mixture of the monomer of Formula I above in which each group R is methyl and a binder, namely a high temperature silicone oil (available from Aldrich Chemical Company, Milwaukee, Wis. 53233 as product #17,563-3; this material is stated by the manufacturer to be a copolymer of methyl methyl siloxane and phenyl methyl siloxane, and has a refractive index of 1.495). The monomer was first added to a sufficient amount of (4-octyloxyphenyl) phenyliodonium hexafluoroantimonate to make the content of the iodonium salt in the final recording medium 2.9 percent by weight. To the monomer/iodonium salt mixture was added the binder and then a sufficient amount of 5,12-bis(phenylethynyl)naphthacene (dissolved in approximately 300 μL of methylene chloride to form a final recording medium containing 0.2% by weight of the naphthacene sensitizer. Methylene chloride was removed from the medium, which had the form of a solution, by evaporating in a nitrogen-purged environment prior to exposure.

A sample of the medium was placed between two glass slides separated by a 100 μm polytetrafluoroethylene spacer. Holographic imaging was carried out using 514.5 nm visible light from an argon ion laser. Unslanted diffraction gratings were recorded in a circular area with a 10 mm radius using an incident semiangle of 25° and equal power densities (±2%) in both beam paths. After 60 seconds laser exposure, the medium was blanket exposed to 10 flashes from a Normark xenon strobe lamp.

To determine the holographic efficiency of the resulting diffraction grating, a probe beam from a 633 nm laser was passed through the medium at an angle of approximately 30.5° (which was calculated to be near the Bragg angle of the hologram) before, during and after the holographic exposure and the strobe exposure. The zeroth order and first order diffractions from the grating were measured, and the holographic efficiency determined. The holographic efficiency of the diffraction grating produced was found to about 5 percent, and the grating had low scatter.

EXAMPLE 2

This Example illustrates a process of the present invention in which the hologram produced during the holographic exposure requires no post-treatment.

A holographic recording medium was prepared comprising a 3:1 w/w mixture of the same monomer (refractive index 1.4762) as in Example 1 above and a binder, namely poly(methyl phenyl siloxane), refractive index 1.5365, available from Dow Chemical Company, Midland, Mich., under the tradename Dow 710 silicone fluid. The monomer was first added to a sufficient amount of (4-octyloxy-phenyl) phenyliodonium hexafluoroantimonate to make the content of the iodonium salt in the final recording medium 5% by weight. To the monomer/iodonium salt mixture was added the binder and then a sufficient amount of 5,12-bis(phenyl-ethynyl)naphthacene (dissolved in approximately 300 μL of methylene chloride) to form a final recording medium containing 0.05% by weight of the naphthacene sensitizer. Methylene chloride was removed from the medium, which had the form of a solution, by purging the medium with argon prior to exposure.

100 μm films of this medium were formed in the same way as in Example 1 above, and these films were exposed to an interference pattern formed using 514.5 nm visible light from an argon ion laser, with the formation of the hologram being measured with a 633 nm probe beam from a helium neon laser in the same way as in Example 1. A 6 second exposure with the argon ion laser (at a power density of 9.33 mW/cm$^2$) showed a threshold energy (the minimum energy required at a given incident irradiance level for diffraction efficiency to be detected) of about 19 mJ/cm$^2$, while the peak in diffraction efficiency, about 75 percent, occurred 2.7 seconds after the end of the holographic exposure.

EXAMPLE 3

Example 1 was repeated, except that the polysiloxane binder used was prepared by hydrosilylation of polymethylhydrosiloxane using a 90:10 w/w mixture of 2-vinylnaphthalene and 2-vinyl(cyclohex-3-ene oxide), and that the monomer:binder ratio was 70:30. After the one minute laser exposure, the grating developed a holographic efficiency of 35 percent.

EXAMPLE 4

This Example illustrates a holographic recording medium comprising a high refractive index monomer and a low refractive index binder.

A holographic recording medium was prepared by mixing 1,2-epoxy-1,2,3,4-tetrahydronaphthalene (refractive index approximately 1.58, 0.2361 g) and poly(butyl methacrylate) (refractive index 1.483, 0.0604 g) in a small vial, then heating to approximately 55° C. with mechanical stirring until a homogeneous solution was obtained. This solution was cooled to room temperature and cyclopentadienyl cumene iron(II) hexafluorophosphate (Irgacure 261, 0.010 g) was added as an acid generator.

The polymerization characteristics of the resultant medium were determined using a differential scanning photocalorimetry, and the result demonstrated rapid polymerization of the monomer upon exposure to 436 nm visible radiation. Holographic exposure in the same manner as in Example 1 but using 488 nm visible light from an argon ion laser without strobe exposure and with two successive laser exposures for 30 and 10 seconds respectively (total exposure 400 mJ/cm$^2$) gave a hologram with approximately 2 percent efficiency.

EXAMPLE 5

A holographic recording medium was formulated by mixing 46.8 parts by weight of a monomer, tetrahydronaphthalene oxide, 45.0 parts by weight of a binder, poly(acryloxypropyl)methyl siloxane (refractive index 1.463, available from Petrarch Systems, Inc., Bristol, Pa. 19007, as product #PS901.5), 3.55 parts by weight of cumene hydroperoxide (available from Atochem, Buffalo, N.Y.) 2.75 parts by weight of the ultraviolet curing agent Darocur (Registered Trade Mark) 1173 (available from Ciba-Geigy Corporation, Ardsley, N.Y. 10502) and 1.86 parts by weight of Irgacure 261. The aforementioned components were added, in the order listed, to an amber glass bottle, and the resultant mixture was stirred with a magnetic stir bar until dissolution was observed and a homogeneous mixture was obtained.

A sample of the medium thus prepared was placed between two glass slides separated by a 50 μm polytetrafluoroethylene spacer. Holographic imaging was carried out by exposing the film to an interference pattern using 476 nm visible light from an argon ion laser at an incident power density of 1.40 mW/cm$^2$ for a period of 8 minutes. Unslanted diffraction gratings were recorded in a circular area using an incident semiangle of 10° and equal power densities in both beam profiles. Formation of the hologram was monitored and measured by passing a 632.8 nm probe beam from a helium neon laser through the sample medium before, during and after the holographic exposure. First order diffraction was observed after about 10 seconds of exposure. The intensity of first order diffraction, detected by the probe beam, attained a plateau value of about 114 μW, which corresponded to a diffraction efficiency of 21 percent; the actual diffraction efficiency must have been greater since the read angle for reconstruction was not optimized. After the holographic exposure, the sample was fixed by exposing it to ultra-violet radiation. After this fixing, the angle-optimized diffraction efficiency was measured as about 52 percent.

EXAMPLE 6

This Example illustrates the use of the present invention to form a reflection hologram produced with very little shrinkage of the holographic medium.

The preparation of the holographic medium described in Example 2 above was repeated except that the amounts of iodonium salt and naphthacene sensitizer were adjusted so that the final imaging medium contained 1 percent by weight of the iodonium salt and 0.11 percent by weight of the sensitizer.

A reflection hologram was formed from the resultant medium by imaging at normal incidence with 514.5 nm light from an argon ion laser, using a flying spot 0.4 cm in diameter at a scan velocity of 0.167 cm/sec and a total exposure energy of 320 mJ/cm$^2$. The reference beam was formed by using an aluminum mirror substrate. The resultant optical density, measured in absorbance units using a Perkin-Elmer Lambda 9 spectrophotometer at the wavelength for the Bragg condition at normal incidence, was 0.236, corresponding to an index modulation of about 0.001, and the full width at half height was 3.5 nm. The ratio of the lambda maximum at 509.9 nm to the imaging wavelength was 0.991, which indicates that the amount of shrinkage occurring during hologram formation was less than 1 percent.

From the foregoing, it will be seen that the present invention provides a holographic medium and process that is capable of providing holograms having high efficiency and good physical properties, and which is not susceptible to many of the problems associated with prior art holographic media and processes using radical polymerization.

We claim:

1. A process for preparing a volume hologram, which process comprises:

providing a holographic recording medium comprising an acid generator which produces an acid upon exposure to actinic radiation; a binder; and at least one monomer or oligomer which undergoes cationic polymerization initiated by the acid produced from the acid generator, the holographic recording medium being essentially free from materials capable of free radical polymerization; and passing into said medium a reference beam of coherent actinic radiation to which the acid generator is sensitive and an object beam of the same coherent actinic radiation, thereby forming within said medium an interference pattern, causing formation of the acid from the acid generator and cationic polymerization of said at least one monomer or oligomer, thereby forming a volume hologram within said medium.

2. A process according to claim 1 wherein the binder is a siloxane polymer or oligomer, or an acrylate.

3. A process according to claim 1 wherein the acid generator produces an acid having a pK$_a$ less than about 0.

4. A process according to claim 3 wherein the acid generator comprises a diaryliodonium salt.

5. A process according to claim 1 wherein the acid produced from the acid generator is a Lewis acid.

6. A process according to claim 5 wherein the acid generator comprises a ferrocenium salt.

7. A process according to claim 1 wherein the acid generator comprises an acid generating component and a sensitizer which renders the acid generating component sensitive to actinic radiation of a wavelength to which the acid generating component is not substantially sensitive in the absence of the sensitizer.

8. A process according to claim 7 wherein, in the absence of the sensitizer, the acid generating component is not substantially sensitive to visible radiation, but the sensitizer renders the acid generating component substantially sensitive to visible radiation.

9. A process according to claim 8 wherein the sensitizer comprises an aromatic hydrocarbon substituted with at least two alkynyl groups.

10. A process according to claim 9 wherein the sensitizer comprises 5,12-bis(phenylethynyl)naphthacene.

11. A process according to claim 1 wherein the monomer or oligomer has at least one epoxide or vinyl ether group.

12. A process according to claim 11 wherein the monomer or oligomer has at least one cyclohexene oxide grouping.

13. A process according to claim 12 wherein the monomer is of the formula:

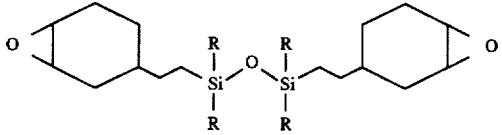

where each R independently is an alkyl group containing not more than about 6 carbon atoms.

14. A process according to claim 11 wherein the monomer is 1,2-epoxy-1,2,3,4-tetrahydronaphthalene.

15. A process according to claim 11 wherein, after the holographic exposure, the whole of the holographic recording medium is exposed to radiation of a wavelength effective to cause further polymerization of the monomer or oligomer.

16. A process according to claim 1 wherein the holographic recording medium comprises from about 1 to about 10 percent by weight of the acid generator, from about 10 to about 89 percent by weight of the binder and from about 10 to about 89 percent by weight of the monomer or oligomer.

17. A process according to claim 1 wherein the hologram formed by the cationic polymerization has a holographic efficiency of at least about 5 percent.

* * * * *